United States Patent
Kojima et al.

[11] Patent Number: 5,858,258
[45] Date of Patent: Jan. 12, 1999

[54] PLASMA PROCESSING METHOD

[75] Inventors: Hiroshi Kojima, Machida; Yoshifumi Tahara, Yamato; Izumi Arai, Yokohama, all of Japan

[73] Assignee: Tokyo Electron Limited, Tokyo, Japan

[21] Appl. No.: 817,961

[22] Filed: Jan. 8, 1992

Related U.S. Application Data

[63] Continuation of Ser. No. 510,124, Apr. 17, 1990, abandoned.

[30] Foreign Application Priority Data

Apr. 18, 1989 [JP] Japan ..................................... 1-99068

[51] Int. Cl.$^6$ ................................ H05H 1/00; B05D 5/00
[52] U.S. Cl. ............................................................. 261/67
[58] Field of Search .................................. 156/643, 646; 134/1

[56] References Cited

U.S. PATENT DOCUMENTS

| | | | |
|---|---|---|---|
| 4,491,173 | 1/1985 | Demand | 165/495.1 |
| 4,534,816 | 8/1985 | Chen et al. | 156/345 |
| 4,565,601 | 1/1986 | Kakehi et al. | 156/643 |
| 4,816,638 | 3/1989 | Ukai et al. | 156/345 X |
| 4,863,561 | 9/1989 | Freeman et al. | 156/646 |
| 4,915,777 | 4/1990 | Jucha et al. | 156/643 |
| 4,931,136 | 6/1990 | Pausch et al | 156/656 X |
| 4,998,979 | 3/1991 | Niino | 134/1 |

OTHER PUBLICATIONS

"Patent Abstracts of Japan", vol. 9, No. 201 (E–336) [1924], Aug. 17, 1985.

"Journal of Vacuum Science Technology", vol. 15, No. 2, Mar./Apr. 1978, pp. 334–337, Amer. Vacuum Soc., N.Y. USA; P.M. Schaible et al.: Reactive ion etching of aluminum and aluminum alloys in an rf plasma containing halogen species.

*Primary Examiner*—Thi Dang
*Attorney, Agent, or Firm*—Oblon, Spivak, McClelland, Maier & Neustadt, P.C.

[57] ABSTRACT

A method of plasma-processing which includes the step of plasma-processing a matter mounted on a component in a plasma processing vessel by using plasma gases, and the step of introducing an inactive gas into the plasma processing vessel when no plasma process is conducted in the vessel and gases resulted from the previous plasma process remain therein.

14 Claims, 3 Drawing Sheets

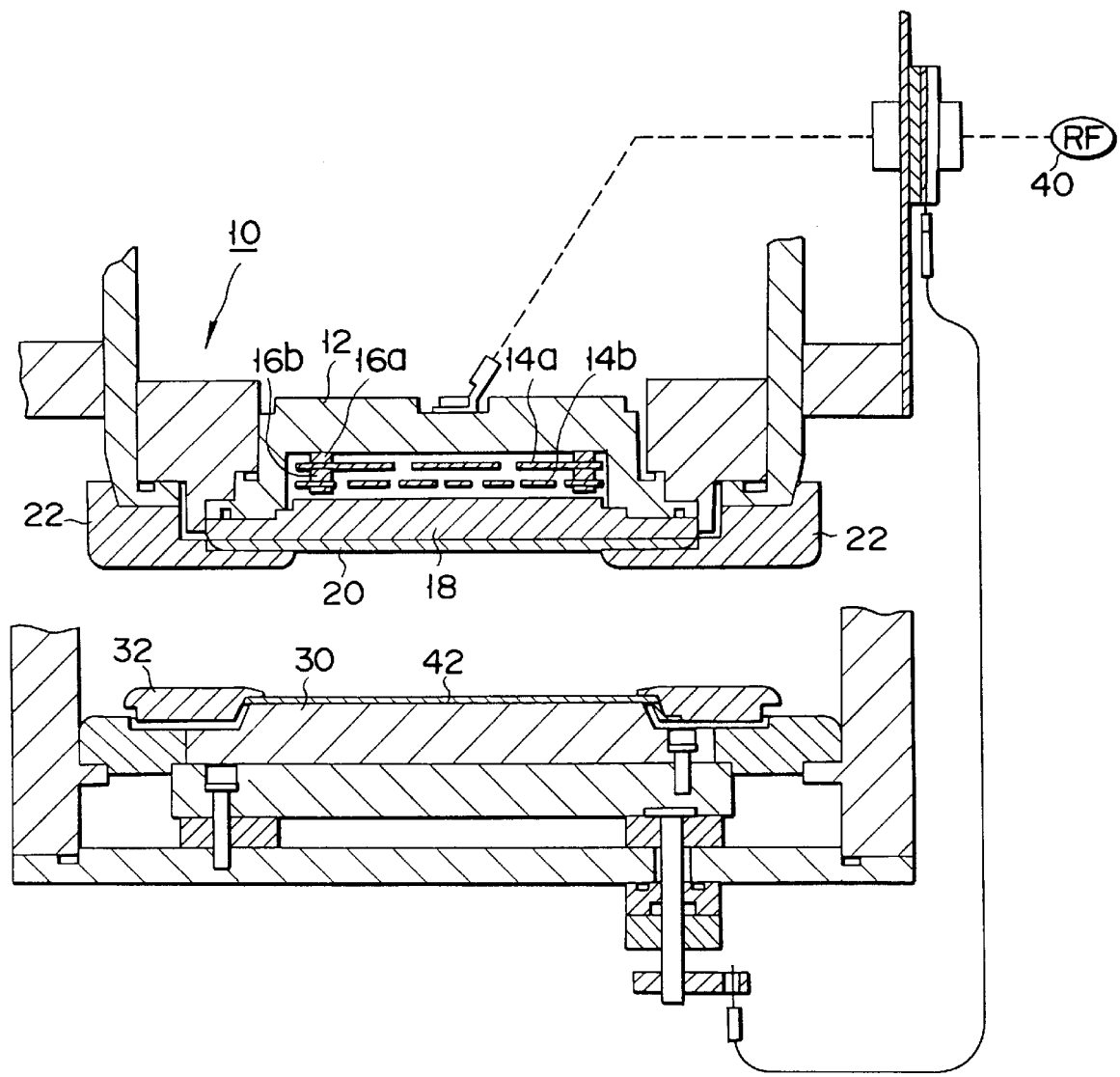
F I G. 1

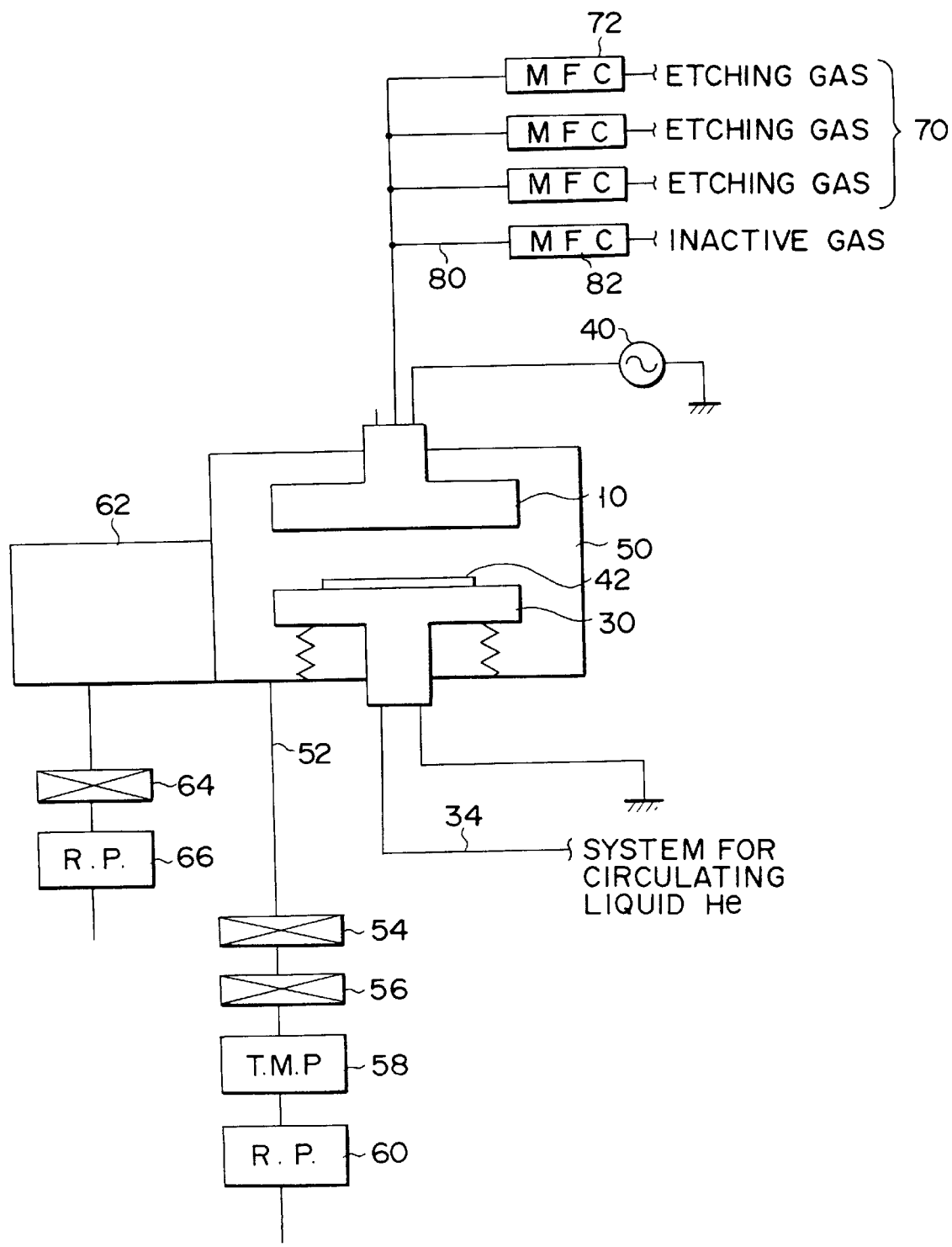
F I G. 2

PLASMA PROCESSING METHOD

This application is a Continuation of Ser. No. 07/510,124, filed on Apr. 17, 1990, now abandoned.

BACKGROUND OF THE INVENTION

1. Field of the Invention

The present invention relates to a plasma processing method.

2. Description of the Related Art

In the case of a plasma process device such as the plasma etching device, upper and lower electrodes are opposed to each other in a plasma processing vessel. A matter to be processed is mounted on the top of the lower electrode. Etching gases are introduced into the plasma processing vessel and RF power is applied between the upper and the lower electrode. As a result, a plasma of the etching gases is excited. Chemical etching is applied to the matter by radicals created in the plasma while applying physical etching to the matter by ions created in the plasma and accelerated by electric field between the upper and the lower electrode.

In order to maintain good etching characteristics in this case, the lower electrode on which the matter is mounted is cooled by liquid He, for example, and the temperature of the matter is thus definitely controlled certain.

Further, the plasma processing vessel is being held under vacuum over a time period from the finish of the plasma etching process to the start of a next plasma etching process. The plasma processing vessel which has been thus held under vacuum to a certain extent is made ready for the next plasma etching process.

Even in the case of this plasma etching device, the etching gases are decomposed to a deposition when they are transformed to plasma. Just after the plasma etching process is finished and the process of placing the plasma processing vessel under vacuum is started, a flow of gas is created in the plasma processing vessel due to the evacuation of the vessel. The deposition is thus exhausted along this flow of gas from the plasma processing vessel.

After the plasma processing vessel has been evacuated to a certain extent, however, the flow of gas is ended. As a result, the deposition is left floating in the plasma processing vessel.

The deposition floating in the plasma processing vessel is gasified by that component which is cooled in the vessel. The deposition adheres to the component in this case. Particularly after the plasma process is finished and the matter is removed from the top of the lower electrode, most of the deposition floating in the plasma processing vessel adheres to the top of the lower electrode on which the matter to be processed is mounted, because the lower electrode is cooled to a predetermined temperature, as described above.

When the matter to be processed is mounted on the top of the lower electrode to which the deposition has adhered and the plasma etching process is applied to the matter under this state, the following problems are caused.

The deposition adhered makes the top of the lower electrode uneven. The distance between the matter which is mounted on the uneven top of the lower electrode and the upper electrode which is located above the matter and opposed thereto becomes different at various points on the face of the matter. As the result, etching characteristics or homogeneity of etching rate relative to the face of the matter is deteriorated accordingly.

Further, the deposition on the top of the lower electrode adheres to the underside of the matter. When the matter is to be processed at a next stage, therefore, the deposition on the underside of the matter acts as particles to thereby decrease the productivity of the matters processed.

SUMMARY OF THE INVENTION

The object of the present invention is to provide a plasma processing method capable of more reliably preventing the deposition from adhering to a component on which a matter to be processed is mounted, enhancing the homogeneity of processing characteristics relative to a face of the matter.

Another object of the present invention is to provide a plasma processing method capable of more reliable preventing the deposition from adhering to a matter to be processed, increasing the productivity of the matters to be processed to a greater extent.

According to the present invention, the plasma process is applied to the matter mounted on the component in a plasma processing vessel by using plasma process gases, and an inactive gas is introduced into the plasma processing vessel when no plasma process is conducted in the vessel and gases resulting from the previous plasma process remain therein.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is an illustrative view showing a brief constitution of a plasma etching apparatus which is used in a method of the present invention;

FIG. 2 shows an arrangement of the plasma etching apparatus to which a method of the present invention is applied.

DETAILED DESCRIPTION OF THE PREFERRED EMBODIMENT

Figure 3:
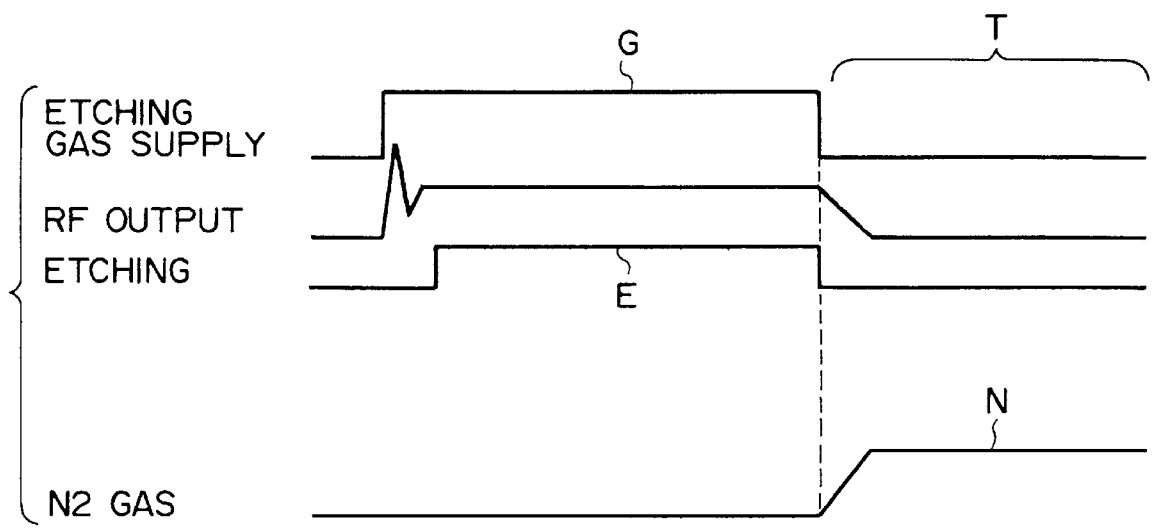
FIG. 3 shows the relationship between etching gas introducing and $N_2$ gas introducing before and after the etching treatment.

A case where the present invention is applied to an etching apparatus as a plasma etching means will be described in detail with reference to the drawings.

FIG. 1 is an illustrative view showing a brief constitution of a plasma etching apparatus which is used in a method of the present invention.

This plasma etching device includes upper and lower electrodes 10 and 30 opposed to each other wherein a semiconductor wafer 42 which is to be etched is mounted on the top of the lower electrode 30. RF power of 380 KHz is applied between the upper 10 and the lower electrode 30 through an RF power source 40. The wafer 42 is etched by plasma created between the upper 10 and the lower electrode 30 by etching gas introduced between them through a plurality of holes in the upper electrode 10.

The upper electrode 10 has a conductive heat transmission member 12 which is shaped like a flange. A cable extending from the RF power source 40 is connected to this heat transmission member 12.

First and second diffusion plates 14a and 14b each having a plurality of holes are held parallel to each other by spacers 16a and 16b in a recess of the heat transmission plate 12. A reinforcing plate 18 and then an amorphous carbon electrode 20 are attached to the open end of the recess in the heat transmission plate 12. A shield ring 22 is mounted on the amorphous carbon electrode 20 along the peripheral rim portion thereof to define the diameter of that area thereof which is exposed to plasma.

The wafer 42 can be mounted on that top of the lower electrode 30 which is swelled like a disk. A ring-shaped clamp member 32 is located round the lower electrode 30 to fixedly hold the wafer 42 between them. The lower electrode 30 is grounded. A system 34 for circulating a cooling medium such as liquid He is arranged on the underside of the lower electrode 30, as shown in FIG. 2, to cool the lower electrode 30 to predetermined temperature.

The upper 10 and the lower electrode 30 are separated from each other and kept parallel to each other in a chamber, as described above, to thereby form an etching apparatus of the parallel-plate type.

A control system for this etching apparatus will be described referring to FIG. 2.

The upper 10 and the lower electrode 30 are housed in a plasma processing vessel 50, which is provided with an exhaust port 52 at the underside thereof. Connected to the exhaust port 52 are an APC (auto pressure control) valve 54, a conductance valve 56, a turbo molecule pump (TMP) 58 and a rotary pump (RP) 60. Another rotary pump (RP) 66 is connected to a load lock chamber 62 through a valve 64, said load lock chamber 62 being located adjacent to the plasma processing vessel 50.

Etching gases such as $CCl_4$, He and $O_2$ or $CF_4$, Ar and $CHF_3$ are introduced into the plasma processing vessel 50 through the upper electrode 10 and the amount of each etching gas supplied through each of etching gas supply systems 70 can be controlled by a mass flow controller (MFC) 72.

A system for supplying inactive gas such as $N_2$ into the plasma processing vessel 50 is also provided with a MFC 82 on the way thereof. This $N_2$ gas can be introduced into the plasma processing vessel 50 at a time when no plasma process is conducted therein. The amount of $N_2$ supplied when no plasma process is conducted in the plasma processing vessel 50 is set 200 to 1000 SCCM, for example, larger than that of the etching gases supplied when plasma process is being conducted, so that a reacted product (or deposition) which will be described later can be more effectively exhausted.

A part of the $N_2$ supply system 80 is common to the etching gas supply systems 70 in the above-described arrangement, but the $N_2$ supply system may be made independent of the etching gas supply systems 70.

An example of the plasma etching method will be described using the above-described plasma etching apparatus.

RF power is applied between the upper 10 and the lower electrode 30 through the RF power source 40 while the etching gases are being introduced from the etching gas supply systems 70 into the plasma processing vessel 50 through the upper electrode 10. Plasma is thus excited between the upper 10 and the lower electrode 30. Radicals created in the plasma are stuck onto the surface of the wafer 42 to cause chemical reaction, while ions decomposed in the plasma are accelerated by electric field generated between the parallel-plate electrodes to collide with the wafer 42. The wafer 42 which is to be etched is thus etched. The etching of this parallel-plate type enables anisotropic etching to be achieved while relatively reducing side etching. In short, etching of micro-patterns can be realized.

After the plasma etching process is finished, the clamp member 32 is lifted to release the wafer 42 from its being clamped between the clamp member 32 and the lower electrode 30. The wafer 42 left on the top of the lower electrode 30 is then supported by a member such as the handler and carried into the load lock chamber 62.

A new wafer 42 in the load lock chamber 62 is then carried into the plasma processing vessel 50 where a next plasma etching process is conducted relative to the new wafer 42.

According to this embodiment, as shown in FIG. 3, the supply of etching gas (G) is exchanged with the supply of $N_2$ gas (N) as an inactive gas by gas supply system 70 and 80 in accordance with the stopping of etching treatment by RF output when no plasma is conducted. Further, the supply of the etching gases into the plasma processing vessel 50 through the gases supply system 70 is stopped at the time when no plasma process is conducted. The inactive gas $N_2$ is introduced into the plasma processing vessel 50 through the $N_2$ supply system 80 while the plasma processing vessel 50 is exhausted through the exhaust port 52.

When the gas $N_2$ is introduced into the plasma processing vessel 50 while exhausting it, as described above, a flow of the gas $N_2$ can be created in it.

The etching gases are decomposed by the plasma in the course of the above-described plasma etching process. As a result, a deposition is created and it remains in the plasma processing vessel 50. This deposition is likely to adhere to that part whose temperature is the lowest in the plasma processing vessel 50.

After the wafer 42 is removed from the plasma processing vessel 50, that part, lowest in temperature in the plasma processing vessel 50, is the surface of the lower electrode 30 which is cooled by the liquid He circulating through the system 34.

However, if the flow of the gas $N_2$ is kept in the plasma processing vessel 50 at the time when no plasma process is conducted therein, the deposition floating in the plasma processing vessel 50 can be exhausted through the exhaust port 52 together with the gas $N_2$ flowing in the vessel 50. In addition, the gas $N_2$ is introduced from above onto the surface of the lower electrode 30 in the case of the above-described plasma etching device. This means that the gas $N_2$ is blown onto the surface of the lower electrode 30. The flow of the gas $N_2$ can act therefore as a film for protecting the surface of the lower electrode 30, so that the deposition can be more reliably prevented from adhering to the surface of the lower electrode 30.

It may be arranged that the inactive gas is blown onto the surface of the lower electrode 30 on which the wafer is mounted.

Another measure of preventing the deposition from adhering to the surface of the lower electrode 30 is to create in the plasma processing vessel 50 a part which is lower in temperature than the surface of the lower electrode 30 or to cool the wall of the plasma processing vessel 50. When the deposition is stuck to the wall of the vessel 50 in this manner, the amount of the deposition stuck to the surface of the lower electrode 30 can be reduced.

Particularly in the case of the plasma etching apparatus, however, it is preferable that the wafer 42 is etched under circumstances as clean as possible. The method of the present invention by which the deposition is exhausted by the gas $N_2$ is therefore by far better. In the case where the deposition is stuck not to the surface of the lower electrode 30 but to the other part or wall of the plasma processing vessel 50, the vessel 50 must be more often cleaned. When the method of the present invention is employed, therefore, the plasma processing vessel 50 can be more easily maintained.

According to the present invention, the inactive gas is introduced into the plasma processing vessel at the time when no plasma process is conducted therein or gas resulted from the plasma process still remains therein.

When no plasma process is conducted, therefore, the flow of the inactive gas can be kept in the plasma processing vessel. This flow of the inactive gas can be realized particularly on the top of the lower electrode which has been cooled to the predetermined temperature, so that the deposition can be prevented by the flow of the inactive gas from adhering to the top of the lower electrode on which the wafer is to be mounted. If the inactive gas is blown onto the top of the lower electrode, the effect of preventing the deposition from adhering to the lower electrode can be further increased.

When the plasma process is to be conducted, therefore, the matter or wafer to be processed can be mounted on that top of the lower electrode which is little concaved and convexed by the deposition. This enables the homogeneity of processing characteristics relative to the wafers to be increased. Further, no deposition adheres to the underside of the wafer. In other words, no particle is created on the underside of the wafer. Therefore, the productivity of the wafers can be increased to a great extent.

Still further, the gas by which the deposition is exhausted from the plasma processing vessel is inactive. Even when the inactive gas still remains in the plasma processing vessel at the start of a next process, therefore, the process is not damaged by the remaining inactive gas.

The present invention can be applied to other plasma processes as well as to the one which is conducted by cooling the lower electrode on which the wafer to be processed is mounted.

Other gases can also be used as the inactive gas instead of $N_2$.

According to the present invention as described above, the inactive gas is introduced into the plasma processing vessel at the time when no plasma process is conducted and gases resulting from the plasma process still remain therein. This can prevent the deposition from adhering to that part, which is lower in temperature, in the plasma processing vessel. The homogeneity of processing characteristics relative to a face of the matter to be processed can be increased accordingly. Because no deposition adheres to the underside of the matter to be process, no particle is created thereon. This enables the productivity of the matters processed to be increased. Further, the gas by which the deposition is exhausted from the plasma processing vessel is inactive. Even when the inactive gas still remains in the plasma processing vessel at the start of a next plasma process, therefore, the process is not damaged by the remaining inactive gas.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

What is claimed is:

1. A method of plasma-etching a wafer by using an apparatus comprising a processing vessel, wafer supporting means provided in the vessel and having a wafer mounting surface, cooling means for cooling the wafer mounting surface, and means for forming a radio-frequency electric field in the vessel, said method comprising the steps of:

loading a wafer on the mounting surface;

etching the wafer by forming a radio-frequency electric field in the vessel and supplying an etching gas into the vessel after loading the wafer, thereby exciting the plasma of the etching gas;

cooling the wafer by the cooling means through the mounting surface during the etching;

stopping the etching by ending supply of the etching gas and the forming of the radio-frequency electric field;

beginning supply of an inactive gas into the vessel in synchronism with said ending of the supply of the etching gas;

exhausting the vessel during said supply of the inactive gas, and,creating a flow of the inactive gas on the wafer and the mounting surface;

unloading the wafer from the mounting surface while continuing said supply of the inactive gas and said exhausting of the vessel, thereby maintaining said flow of the inactive gas on the wafer and the mounting surface; and continuing said supply of the inactive gas and said exhaustion of the vessel after unloading the wafer, thereby maintaining said flow of the inactive gas on the mounting surface and preventing by-products from adhering to the mounting surface which has been cooled and exposed.

2. The method according to claim 1, wherein the step of supplying the inactive gas comprises blowing the inactive gas directly onto the wafer and the mounting surface.

3. The method according to claim 2, wherein the step of supplying the inactive gas comprises forming a protective gas film of an inactive gas flow over the wafer and the mounting surface.

4. The method according to claim 3, wherein a supply rate of the inactive gas after etching the wafer is greater than that of the etching gas during etching the wafer.

5. The method according to claim 3, wherein the inactive gas is $N_2$ gas.

6. The method according to claim 3, wherein the means for forming a radio-frequency electric field comprises first and second electrodes located in the vessel and forming a parallel-plate structure.

7. The method according to claim 6, wherein the mounting surface is formed on the first electrode.

8. The method according to claim 3, wherein the etching and inactive gases are supplied through a single line.

9. A method of plasma-etching a wafer by using an apparatus comprising a processing vessel, load lock chamber means connected to the vessel, a first electrode provided in the vessel and having a wafer mounting surface, cooling means for cooling the wafer mounting surface, a second electrode located opposite the first electrode, and means for impressing an RF voltage between the first and second electrodes, said method comprising the steps of:

loading a wafer into the vessel from the load lock chamber means and mounting it on the mounting surface;

etching the wafer by impressing an RF voltage between the first and second electrodes and supplying an etching gas into the vessel after loading the wafer, thereby exciting the plasma of the etching gas;

cooling the wafer by the cooling means through the mounting surface during the etching;

stopping the etching by ending supply of the etching gas and impressing of the RF voltage;

beginning supply of an inactive gas into the vessel in synchronism with said ending of the supply of the etching gas;

exhausting the vessel during said supply of the inactive gas, and creating a flow of the inactive gas on the wafer and the mounting surface;

removing the wafer from the mounting surface and unloading it from the vessel to the load lock chamber means while continuing said supply of the inactive gas and said exhausting of the vessel, thereby maintaining said flow of the inactive gas on the wafer and the mounting surface; and continuing said supply of the inactive gas and said exhaustion of the vessel after unloading the wafer, thereby maintaining said flow of the inactive gas on the mounting surface and preventing by-products from adhering to the mounting surface which has been cooled and exposed.

10. The method according to claim 9, wherein the step of supplying the inactive gas comprises blowing the inactive gas directly onto the wafer and the mounting surface.

11. The method according to claim 10, wherein the step of supplying the inactive gas comprises forming a protective gas film of an inactive gas flow over the wafer and the mounting surface from the second electrode.

12. The method according to claim 11, wherein a supply rate of the inactive gas after etching the wafer is greater than that of the etching gas during etching the wafer.

13. The method according to claim 11, wherein the inactive gas is $N_2$ gas.

14. The method according to claim 11, wherein the etching and inactive gases are supplied through a single line.

* * * * *